United States Patent [19]

Flynn et al.

[11] Patent Number: 5,089,152
[45] Date of Patent: Feb. 18, 1992

[54] WATER DISPLACEMENT COMPOSITION

[75] Inventors: Richard M. Flynn, White Bear Lake; Douglas A. Johnson, Stillwater; John G. Owens, White Bear Lake, all of Minn.

[73] Assignee: Minnesota Mining and Manufacturing Company, St. Paul, Minn.

[21] Appl. No.: 688,906

[22] Filed: Apr. 19, 1991

[51] Int. Cl.$^5$ ................................................ C09K 3/00
[52] U.S. Cl. ..................................... 252/194; 252/545; 252/DIG. 1
[58] Field of Search .................. 252/194, 545, DIG. 1

[56] References Cited

U.S. PATENT DOCUMENTS

| | | | |
|---|---|---|---|
| 2,915,554 | 12/1959 | Ahlbrecht et al. | 260/556 |
| 3,397,150 | 8/1968 | Burt et al. | 252/194 |
| 3,450,755 | 6/1969 | Ahlbrecht et al. | 260/556 |
| 3,509,061 | 4/1970 | Zisman et al. | 252/171 |
| 3,792,977 | 2/1974 | Guenthner | 8/169 |
| 3,903,012 | 9/1975 | Brandreth | 252/194 |
| 3,962,798 | 6/1976 | Jackson | 34/9 |
| 4,169,807 | 10/1979 | Zuber | 252/171 |
| 4,182,687 | 1/1980 | Bartlett | 252/194 |
| 4,289,892 | 9/1981 | Soch | 560/26 |
| 4,307,518 | 12/1981 | Izumo et al. | 34/9 |
| 4,491,531 | 1/1985 | Bargigia et al. | 252/153 |
| 4,510,335 | 4/1985 | Lagow et al. | 568/683 |
| 4,594,177 | 6/1986 | Lantz et al. | 252/194 |
| 4,655,958 | 4/1987 | Jung et al. | 252/194 |
| 4,689,170 | 8/1987 | Zyhowski et al. | 252/194 |
| 4,763,423 | 8/1988 | Kemp, Jr. | 34/9 |
| 4,828,751 | 5/1989 | Kremer | 252/171 |
| 4,936,921 | 6/1990 | Berruex | 134/1 |
| 4,963,283 | 10/1990 | Laphem et al. | 252/79.3 |

FOREIGN PATENT DOCUMENTS 0394994  4/1990  European Pat. Off. .
0403962  6/1990  European Pat. Off. .
2220951A 7/1989  United Kingdom .

OTHER PUBLICATIONS

FREON Solvent Data, Bulletin No. FS-19C, Drying With "Freon" T-DFC Solvent, U.S. Pat. No. 4,182,687, pp. 1-4.

Fluorinert Liquids, Issued Feb. 1991, 3M Industrial Chemical Products Division.

Corpane Industries, Inc., High Efficiency Cleaning and Finishing Systems, 1983.

News Focus, Products, Users Grapple with Realities of CFC Phaseout, pp. 7-13, Jul. 24, 1989.

Primary Examiner—Robert L. Stoll
Assistant Examiner—Nina Bhat
Attorney, Agent, or Firm—Gary L. Griswold; Walter N. Kirn; Carolyn V. Peters

[57] ABSTRACT

A liquid composition comprising (a) predominantly by weight, a normally liquid, perfluorinated, chlorine-free, inert solvent and (b) a nonionic, fluoroaliphatic surface active agent soluble in the solvent, and a process of displacing water from a surface which includes contacting the surface with water displacement composition of the invention.

10 Claims, No Drawings

WATER DISPLACEMENT COMPOSITION

This invention relates to fluorocarbon compositions and to their use as water displacement compositions in drying wet articles.

Water removal from processed articles is a manufacturing step in the metal finishing, assembly and electronic industries. There are several methods commonly used to accomplish this task. Some of these methods include evaporative, centrifugal, absorbent and solvent drying, (see E. I. Du Pont de Nemours & Co. (Inc.) Technical Bulletin No. FS-19C (E-25798 5M, 1982)). All of the methods have distinct advantages and disadvantages.

As described in the Du Pont Technical Bulletin, supra, evaporative or hot air drying employs heat to remove residual water by vaporization. This method requires high temperatures, that is, in the boiling point range of water, and typically leaves behind nonvolatile material that has been suspended or dissolved in the water. However, water lodged in small crevices or remaining as a thin water film is not removed using this method. Centrifugal drying is typically used only as a gross means of dispersing water. Generally, only the water retained in free-draining articles is removed. The thin water film that remains must be removed in an alternative manner. For delicate electronic components, stress arising from centrifugal forces may be detrimental. Absorption drying requires transferring moisture from manufactured articles to a porous medium. This process creates a set of different problems, associated with removal and disposal of the porous materials, as well as with leaving a fine powdery residue on the articles. Absorption drying may be acceptable for bulk processed materials but would be unsuitable for delicate electronic components.

As further described, the method of choice for electronic components, magnetic media and associated equipment, such as disk drive heads, is solvent drying. There are at least two ways that solvents can remove water from a surface. The first method is by dissolving the water into the solvent itself. For example, water-containing articles are placed in a bath containing flammable polar solvents such as acetone or alcohol (an example of the use of a flammable solvent is described in EP 0 403 962 (Daikin) in which a dehydrating agent comprising a fluorine-containing alcohol or an agent comprising a fluorine-containing agent and water is used to dehydrate articles).

Typically, the solvents rapidly become saturated with water. This makes the process less efficient and ultimately results in leaving behind a solvent or water residue. Once the solvents become saturated, they must be recycled by distillation or discarded. While effective, this method creates a hazardous waste problem. In addition, the use of such flammable solvents poses unacceptable safety hazards.

An alternative method of drying, described in the references cited below, displaces water through preferential wetting of the surfaces of articles. The displaced water is subsequently separated from the denser water-insoluble solvent.

There are many water displacement compositions used in the alternative method that comprise a chlorofluorocarbon solvent and surfactant, see, for example, U.S. Pat. Nos. 4,689,170 (Zyhowski et al.), 4,655,958 (Jung et al.), 4,307,518 (Izumo et al.), 4,491,531 (Bargigia et al.), and 3,903,012 (Brandreth).

U.S. Pat. No. 4,182,687 (Bartlett) describes a liquid-water displacement composition consisting essentially of a chlorofluorocarbon and certain tetraalkyl ammonium compounds wherein the cationic moiety of the ammonium compound has the general formula

wherein m is 2 or 3, n is 1 or 2, the (m+n) is 4, R is an alkyl group with 6 to 18 carbons, and R' is an alkyl group with 1 to 2 carbons.

U.S. Pat. No. 4,594,177 (Lantz et al.) describes a demoisturizing composition comprising a chlorofluorocarbon and certain quanternary ammonium salts as surface active agents corresponding to the formula

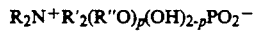

wherein R is an alkyl group having 6 to 18 carbon atoms, $R_2'$ is an alkyl group having 1 to 2 carbon atoms, R" is an alkyl group having 1 to 18 carbon atoms, and p is a value ranging between 1 and 2.

U.S. Pat. No. 4,491,531 (Bargigia et al.) describes a liquid composition based on a chlorofluorocarbon (CFC) solvent and certain surfactants consisting of a salt of an aliphatic diamine and an alkyl-mono- or di-ester of phosphoric acid.

In U.S. Pat. No. 3,903,012 (Brandreth), the liquid water-displacement composition described, comprises a chlorine/fluorine containing compound, and certain surfactants selected from cationic, anionic, and non-ionic/amphoteric surfactants.

Although the above referenced patents described effective water displacement compositions, the solvents used in these compositions are chlorofluorocarbons (CFCs). International restrictions, such as those imposed by the Montreal Protocol, which is implemented in the United States by the Environmental Protection Agency (EPA), currently require that the production of certain CFCs, including 1,1,2-trichlorotrifluoroethane (CFC-113) (commercially available as Freon TM 113 from Du Pont Wilmington, Del.) and trichlorofluoromethane (CFC-11) (commercially available as Freon TM 11 from Du Pont, Wilmington, Del.) be significatnly reduced by mid-1998. CFCs fall into the Montreal Protocol category of "Substances That Deplete the Ozone Layer." The processes, chemicals and technologies that must replace CFCs are still being identified. Many have earmarked hydrofluorocarbons (HFCs) and hydrochlorofluorocarbons (HCFCs) as replacements for CFCs. However, as pointed out in an article in Chemical & Engineering News, HCFCs and HFCs are not "drop-in" replacements for CFCs. See "Producers, Users Grapple with Realities of CFC Phaseout," Chem. & Eng. News, July 24, 1989, pgs 7-13. In that same article, it is stated that the key to developing alternatives (to CFCs) is to match the physical properties of the CFCs being replaced. However, obtaining an HFC or an HCFC replacement for the CFC solvent is not merely a matter of replacing the chlorine with a hydrogen or even obtaining a match of physical properties, such as density or boiling point. This is also true for replacing CFCs with perfluorocarbon solvents. There are a wide variety of synthetic routes, starting from a number of possible materials, to the desired replacements. Each conceivable route has different problems associated with it, thus making the concept of "drop-in" replacements more complex than would appear on the surface.

U.S. Pat. No. 4,491,531 (Bargigia et al.) describes a liquid composition based on certain fluorinated hydrocarbon solvents and certain surfactants consisting of a salt of an aliphatic diamine and an alkyl-mono- or diester of phosphoric acid. U.S. Pat. No. 3,903,012 (Brandreth) describes a liquid composition based on certain fluorine-containing compounds and at least one surfactant selected from cationic, anionic, and nonionic/amphoteric surfactants. However, in both Bargigia et al. and Brandreth the examples only illustrate the use of CFC solvents.

Cationic, anionic, and amphoteric surfactants find great utility in a variety of applications including residue-free drying, as illustrated above. However, such strongly polar, charged species require a correspondingly polar solvent. Chlorofluorocarbons, especially CFC-113 and CFC-11 are suitable solvents for many of these types of surfactants. Superficially, the use of another perhalogenated solvent such as, for example, perfluorohexane, might be supposed to have similar solubility characteristics to CFC-113 or CFC-11, and might prove to be a drop-in replacement for CFC-113 or CFC-11 in residue-free drying applications. This however is not true; cationic, anionic and amphoteric surfactants are completely insoluble in perfluorohexane and cannot function as surface active agents in the water displacement compositions.

Briefly, in one aspect of the present invention, a liquid composition for water displacement is provided comprising (a) predominantly by weight, a normally liquid, perfluorinated, chlorine-free, inert solvent, and (b) a nonionic, fluoroaliphatic surface active agent soluble in the solvent. Such solvent having a density greater than that of water, enabling such compositions to displace the water on wet articles such that the displaced water rises to the top and floats on the upper surface of the composition.

The perfluorinated solvents can be perfluoroaliphatic compounds, having 5 to 18 carbon atoms, optionally containing one or more catenary heteroatoms, such as divalent oxygen or trivalent nitrogen and include perfluoroalkanes (occasionally referred to as PFCs). The term "perfluorinated solvent" as used herein includes organic compounds in which all (or essentially all) of the hydrogen atoms are replaced with fluorine atoms.

Specific useful perfluorinated liquids include the following: perfluoropentane, perfluorohexane, perfluoroheptane, perfluorooctane, perfluorotributyl amine, perfluorotriamyl amine, perfluoro-N-methylmorpholine, perfluoro-N-ethylmorpholine, perfluoro-N-methyl pyrrolidine, perfluoro-1,2-bis(trifluoromethyl)hexafluorocyclobutane, perfluoro-2-butyltetrahydrofuran, perfluorotriethylamine, perfluorodibutyl ether, and mixtures of these and other perfluorinated liquids. Commercially available perfluorinated solvents that can be used as these solvents include: Fluorinert TM FC-43, Fluorinert TM FC-70, Fluorinert TM FC-72, Fluorinert TM FC-77, Fluorinert TM FC-84 and Fluorinert TM FC-87 (Fluorinert TM Liquids, product bulletin 98-0211-6086(212)NPI, issued 2/91, available from 3M Co., St. Paul, Minn.)

Perfluorinated solvents with a solvent density greater than 1 g/cc and preferably at least 1.6 g/cc permits the displaced water (density of 1 g/cc) to float to the surface of the solvent. The solvent preferably boils in the range of 30° to 260° C., more preferably in the range of 50° to 100° C. and is normally liquid at room temperature. The solvent typically has a solubility parameter of less than 7.

A class of surface active agents useful in the present invention are those nonionic, fluoroaliphatic compounds that contain at least three fluorine atoms. The fluoroaliphatic group contains 3 to 20 carbon atoms, and preferably 6 to 12 carbon atoms. The skeletal chain of the fluoroaliphatic group can be a straight chain, a branched chain, and if sufficiently large, cyclic, or combinations thereof, such as alkylcycloaliphatic groups. The skeletal chain optionally includes one or more catenary divalent oxygen or trivalent nitrogen atoms bonded only to carbon atoms, such heteroatoms being a chemically stable linkage between fluorocarbon portions of the fluoroaliphatic group and not interfering with the inert character of the fluoroaliphatic group.

The surface active agents are preferentially soluble in the solvent up to the boiling point of the solvent and are not substantially extracted from the solvent by water. Since it is undesirable to leave a residue of surface active agent on dried articles, the water-displaced articles are typically rinsed with pure ("neat") solvent. Preferably, the neat solvent is the same solvent used in the water displacement composition, however other solvents can be used. To minimize residue on the water-displaced articles, concentrations of surface active agents used in the water displacement compositions of the present invention are in an amount sufficient to impart water displacement characteristics to the water displacement compositions. These concentrations are typically in the range of 0.01 wt. % to 5 wt. %, preferably in the range of 0.05 wt. % to 0.2 wt. % relative to the solvent. However, the solubility of the surface active agent may be greater than the recommended upper concentration limit. It is not necessary that the surface active agent be soluble in the solvent at ambient temperature. Since the operating temperature of the process of drying by water displacement can be anywhere from room temperature up to the boiling point of the solvent, the surface active agents of the present invention need only be soluble at the operating temperature of the process.

A preferred class of surface active agents used in this invention are nonionic, perfluoroaliphatic amidoalkanols which can be represented by the following general formula I.

(I)

$R_f$ is a divalent, inert, perfluoroaliphatic group containing 3 to 20 carbon atoms, and preferably 6 to 12 carbon atoms. The skeletal chain of $R_f$ can be straight chain, branched chain, and if sufficiently large, cyclic, or combinations thereof, such as alkylcycloaliphatic radicals. The skeletal chain optionally includes one or more catenary divalent oxygen or trivalent nitrogen atoms bonded only to carbon atoms, such heteroatoms being a chemically stable linkage between fluorocarbon portions of the fluoroaliphatic group and not interfering with the inert character of the $R_f$ group.

$R^1$ is hydrogen or a lower alkyl group having 1 to 6 carbon atoms, which can be straight chain, branched chain or cyclic, or combinations thereof, such as alkylcycloaliphatic radicals. Preferably $R^1$ is hydrogen or a lower alkyl group with 1 or 2 carbons.

$R^2$ is an aliphatic group containing 2 to 12 carbon atoms, and preferably 2 to 8 carbon atoms, and further contains at least one hydroxyl, one of which may be terminal. The skeletal chain of $R^2$ can be straight chain, branched chain, and if sufficiently large, cyclic, or combinations thereof, such as alkylcycloaliphatic radicals. The skeletal chain optionally includes one or more catenary heteroatoms, such as a divalent oxygen bonded only to carbon atoms.

Z is a carbonyl group or a sulfonyl group.

Y is fluorine, $F_5SCF_2$-, or $$R^1-N-Z-$$
$$|$$
$$R^2$$

wherein $R^1$, $R^2$, and Z are as defined above.

A first subclass of surface active agents of the present invention are perfluoroaliphatic carboxamidoalkanols. An example of this subclass is represented by the following general formula II.

$$Y-R_f^3-CON\begin{matrix}R^1\\ \\R^2\end{matrix} \quad (II)$$

$R^3_f$ is a divalent, inert, perfluoroaliphatic group, containing 3 to 20 carbon atoms. The skeletal chain of $R^3_f$ can be straight chain, branched chain, and if sufficiently large, cyclic, or combinations thereof, such as alkylcycloaliphatic radicals. The skeletal chain includes carbon, fluorine, and at least one catenary divalent oxygen atom bonded only to carbon atoms, such heteroatom being a chemically stable linkage between fluorocarbon portions of the fluoroaliphatic group and not interfering with the inert character of the $R^3_f$ radical.

$R^1$, $R^2$, and Y are as defined above.

A second subclass of surface active agents used in the present invention are perfluoroaliphatic sulfonamidoalkanols. An example of this subclass is represented by the following general formula III.

$$Y-R_f-SO_2N\begin{matrix}R^1\\ \\R^2\end{matrix} \quad (III)$$

wherein $R_f$, $R^1$, $R^2$, and Y are as defined above.

Specific fluoroaliphatic substituted compounds that can be used as surface active agents of this invention and represented by formulas II and III include:

$C_4F_9OC_2F_4OCF_2CONHC_2H_4OH$, $C_5F_{11}OC_2F_4OCF_2CONHC_2H_4OH$, $C_6H_{13}OC_2F_4OCF_2CONHC_2H_4OH$, $C_3F_7O[CF(CF_3)CF_2O]_nCF(CF_3)CONHC_2H_4OH$, $n_{avg} = 4$ to 5, $CF_3O[C_2F_4O]_2CF_2CONHC_2H_4OH$, $CF_3O[C_2F_4O]_nCF_2CONHC_2H_4OH$, n = 4 to 6, -continued $C_4F_9O[CF(CF_3)CF_2O]_2CF(CF_3)CONHC_2H_4OH$, c-$C_6F_{11}CF_2O[CF(CF_3)CF_2O]_nCF(CF_3)CONHC_2H_4OH$, $n_{avg} = 1.2$, $C_4F_9OCF(CF_3)CONHC_2H_4OH$, $C_4F_9OC_2F_4OCF_2CON(CH_3)C_2H_4OH$, $C_4F_9OC_2F_4OCF_2CONHC_2H_4OC_2H_4OH$, $C_6F_{13}OC_2F_4OCF_2CONHCH_2CH(OH)CH_2OH$, $CF_3(C_2F_4O)_6CF_2CONHCCH_3(CH_2OH)_2$, $HOC_2H_4NHCOCF(CF_3)O(CF_2)_4-$ $-OCF(CF_3)CF_2OCF(CF_3)CONHC_2H_4OH$, $C_8F_{17}SO_2N(C_2H_5)(C_2H_4O)_nH$, n = 1 to 4

$C_8F_{17}SO_2N(C_2H_5)(C_2H_4O)_m[CH_2CH(CH_3)O]_nH$, n = 0 to 5, m = 0 to 4, such that (m + n) is greater than zero but less than 7.

Generally, because some of the surface active agents are obtained as mixtures of isomeric and homologous compounds, and may result in a range of materials of similar composition, the surface active agents used in this invention may be a mixture of compounds whose average composition may be those described by the formulas given above. Further, a combination of two or more surface active agents are also within the scope of the present invention. Surface active agents falling within the scope of the above formulas are known in the art, e.g. U.S. Pat. Nos. 2,803,656 (Ahlbrecht et al.), 2,915,554 (Ahlbrecht et al.), 3,450,755 (Ahlbrecht), 3,792,977 (Guenthner), and 4,289,892 (Soch) and U.S. patent application, Ser. No. 07/486,115, filed Feb. 28, 1990 all of which are incorporated herein by reference. Surface active agents with poly(oxyalkylene) moieties can be obtained by several methods, such as by the oxyalkylation or condensation of ethylene oxide and propylene oxide with fluorine-containing compounds having at least one active hydrogen atom, e.g. $R_fSO_2N(R')CH_2CH(OH)CH_2OH$, where R' is lower alkyl or hydrogen. Such oxyalkylation can be accomplished by known procedures, for example as described in U.S. Pat. No. 2,915,554 (Ahlbrecht et al.).

The water displacement compositions of the present invention are useful for solvent drying processes of process articles from metal finishing, assembly, and electronic industries, such as integrated circuit boards, disk drive heads, magnetic disk media, magnetic disk drive housings. Solvent drying operates on a displacement principal, wherein liquid water along with any water soluble contaminants is displaced from the surface of the article by preferentially wetting of the surface of the article by the water displacement compositions. The process utilizes the high density and low surface tension characteristics of the water displacement compositions of the present invention.

The process of drying by water displacement comprises (1) immersing a wet article into a liquid composition of the present invention, for a period of time sufficient to displace the water on the wet article; (2) agitating the wet article either by boiling the water displacement composition or by external agitation means, wherein the agitation means is ultrasonic motion or mechanical agitation; (3) separating the displaced water from the water displacement composition; (4) removing the resulting water-free article from the water displacement composition. Preferably, the water-free article is immersed in neat solvent to remove any residual surface active agent that may adhere to the article. Upon removal from the solvent, the article is dry, that is, water-free and residue-free. The drying process may occur at any temperature from ambient temperature up to the boiling point of the solvent used in the water displacement composition.

Water-drying equipment such as that manufactured by Corpane Industries, Inc., Louisville, Ky., provides efficient water removal and rinse facilities and provides optimal effectiveness of the residue-free drying process. The process comprises the steps of:

(1) placing articles in an open-mesh screen or fixture holder and lowering the holder into a first sump containing a water displacement composition of the present invention;

(2) agitating the water displacement composition to dislodge any trapped water between articles or components on the articles, wherein agitation is provided by boiling the water displacement composition, alternatively by an external means such as ultrasound or mechanical agitation;

(3) removing the holder containing the articles from the sump after a predetermined period of time and maintaining the holder over the first sump to permit excess composition to drain back into the first sump;

(4) rinsing the articles by immersing the holder into a second sump containing solvent; and (5) optionally, rinsing the articles by immersing the holder into a third sump containing solvent.

This invention is further illustrated by the following examples. However, these examples are merely for illustration purposes and in no way are to be construed to limit or otherwise restrict the scope of the present invention. All materials are commercially available unless otherwise stated or apparent. The water removal legend in Tables 1 to 4 are interpreted as follows:

| | |
|---|---|
| + | ~75% removal in 60 secs |
| ++ | ~100% removal in 60 secs |
| − | some removal of water (3 to 5 minutes) |
| −− | essentially no removal of water (greater than 15 minutes) |

EXAMPLE 1

The efficacy of a water displacement composition to remove water from wetted surfaces was determined by the following procedure:

A water displacement composition comprising 0.15 wt. % of $C_8F_{17}SO_2N(C_2H_5)(C_2H_4O)_nH$ (where n=1 to 4) in FC-72 was placed into the first sump of a water drying unit manufactured by Corpane Industries, Louisville, Ky. The unit was maintained at or near the boiling point of the solvent, such that a zone of saturated solvent vapor was present during the entire process. Wetted articles (3.5 inch magnetic disk drive housings) were subjected to the following steps:

(1) passing the wetted articles through the vapor zone and immersing them into the sump containing the water displacement composition for approximately 60 seconds;

(2) transferring the articles to a second sump containing neat solvent, without exiting the vapor zone, such that the articles remained in the second sump for approximately 60 seconds; and (3) removing the articles from the unit and examining the articles for residual water and residue spots.

All visible water was displaced from the articles. The process also sufficiently removed excess surface active agent from the articles and left no visible residue on the surface of the test articles.

EXAMPLES 2-11

A series of water displacement compositions were prepared using the first subclass of surface active agents and solvents listed in Tables 1a and 1b. The percent concentrations of the surface active agents and the results of the efficacy of the compositions are also shown.

The use of water displacement compositions as described in Tables 1a and 1b was evaluated by preparing a water displacement composition by admixing a surface active agent with a perfluorinated solvent.

First, an article, such as a printed circuit board (50 mm × 66 mm FR4 board containing a 14-pin through-hole ceramic dual in-line package (DIP), a 14-pin surface mounted plastic DIP and a 20 lead ceramic chip carrier) was wetted with de-ionized water. The wetted article was placed into a vessel containing a water displacement composition as described in Tables 1a and 1b. The composition was heated to its boiling point. A saturated zone of vapor having the same composition as the solvent contained in the water displacement composition was maintained above the boiling composition. The articles were agitated in the water displacement composition for approximately 30 to 120 seconds. The agitation dislodged and displaced any adhering water. The articles were then raised from the boiling solution into the saturated vapor zone where they remained for approximately 30 to 60 seconds. This allows drainage of excess solution back into the vessel and minimizes fluid carryout. The articles were then removed from the vapor zone and examined visually for the presence of residual water.

Tables 1a and 1b demonstrate the utility of a variety of carboxamide surface active agents.

TABLE 1

| Example No. | Surface Active Agent | Solvent | Conc. of Agent (wt. %) | Water Removal |
|---|---|---|---|---|
| 2a | $C_4F_9OC_2F_4OCF_2CONHC_2H_4OH$ | FC-72 | 0.1 | + |
| 2b | $C_4F_9OC_2F_4OCF_2CONHC_2H_4OH$ | FC-72 | 0.2 | ++ |
| 3 | $C_5F_{11}OC_2F_4OCF_2CONHC_2H_4OH$ | FC-72 | 0.1 | ++ |
| 4 | $C_6F_{13}OC_2F_4OCF_2CONHC_2H_4OH$ | FC-72 | 0.1 | ++ |
| 5 | $C_3F_7O[CF(CF_3)CF_2O]_nCF(CF_3)CONHC_2H_4OH$, ($n_{avg}$ = 4 to 5) | FC-72 | 0.1 | ++ |
| 6 | $CF_3O[C_2F_4O]_2CF_2CONHC_2H_4OH$ | FC-72 | 0.1 | + |
| 7 | $CF_3O[C_2F_4O]_nCF_2CONHC_2H_4OH$, (n = 4 to 6) | FC-72 | 0.1 | + |
| 8 | $C_4F_9O[CF(CF_3)CF_2O]_2CF(CF_3)CONHC_2H_4OH$ | FC-72 | 0.15 | ++ |
| 9 | $c\text{-}C_6F_{11}CF_2O[CF(CF_3)CF_2O]_nCF(CF_3)CONHC_2H_4OH$, | FC-72 | 0.15 | + |

TABLE 1-continued

| Example No. | Surface Active Agent | Solvent | Conc. of Agent (wt. %) | Water Removal |
| --- | --- | --- | --- | --- |
| | ($n_{avg}$ = 1.2) | | | |
| 10 | $C_4F_9OCF(CF_3)CONHC_2H_4OH$ | FC-72 | <0.15 | + |
| 11 | $C_4F_9OC_2F_4OCF_2CON(CH_3)C_2H_4OH$ | FC-72 | 0.15 | ++ |
| 12 | $C_4F_9OC_2F_4OCF_2CONHC_2H_4OC_2H_4OH$ | FC-72 | 0.15 | ++ |
| 13 | $C_6F_{13}OC_2F_4OCF_2CONHCH_2CH(OH)CH_2OH$ | FC-72 | 0.15 | ++ |
| 14 | $CF_3O(C_2F_4O)_6CF_2CONHCCH_3(CH_2OH)_2$ | FC-72 | <0.15 | ++ |
| 15 | $HOC_2H_4NHCOCF(CF_3)O(CF_2)_4-OCF(CF_3)CF_2OCF(CF_3)CONHC_2H_4OH$ | FC-72 | <0.15 | + |

COMPARATIVE EXAMPLES C1–C7

Another series of water displacement compositions were prepared using the surface active agents and solvents listed in Table 2. The percent concentrations of the surface active agents and the results of the efficacy of the compositions are also shown.

The efficacy of water displacement compositions as described in Table 2 was evaluated by preparing a water displacement composition by admixing a surface active agent with a perfluorinated solvent. The testing and evaluation are as described in Examples 2–15.

Table 2 demonstrates that not all perfluoroaliphatic carboxamidoalkanols are suitable as surface active agents. In addition to the requirement that this class of agents have both a carboxamide group and at least one hydroxyl group, Table 2 shows that solubility of the agent in the perfluorinated solvent at the operating temperature is also a necessary factor. Examples C1–C5 were insoluble in the perfluorinated solvent FC-72 and were found to be ineffective in this application. Examples C6 and C7 show that a hydroxyl group is critical to the use of perfluoroaliphatic carboxamidoalkanols as surface active agents. Both of these compounds, that have a carboxamide group but no hydroxyl group, were freely soluble in FC-72 but did not function as surface active agents.

EXAMPLES 16–20

A series of water displacement compositions were prepared using the second subclass of surface active agents and solvents listed in Table 3. The percent concentrations of the surface active agents and the results of the efficacy of the compositions are also shown.

The efficacy of water displacement compositions as described in Table 3 was evaluated by preparing a water displacement composition by admixing a surface active agent with a perfluorinated solvent. The testing and evaluation are as described in Examples 2–15.

Table 3 demonstrates the utility of the second class of surface active agents which are perfluoroaliphatic sulfonamidoalkanols. The use of oligomeric mixtures of surface active agent having ethylenoxy or propylenoxy units are shown in Examples 16–20.

TABLE 3

| Example No. | Surface Active Agent | Solvent | Conc. of Agent (wt. %) | Water Removal |
| --- | --- | --- | --- | --- |
| 16 | $C_8F_{17}SO_2N(C_2H_5)(C_2H_4O)_nH$ (n = 1 to 4) | FC-72 | 0.1 | ++ |
| 17 | $C_8F_{17}SO_2N(C_2H_5)(C_2H_4O)_nH$ (n = 1 to 4) | FC-84 | 0.15 | ++ |
| 18a | $C_8F_{17}SO_2N(C_2H_5)(C_2H_4O)_nH$ (n = 1 to 4) | FC-77 | 0.15 | ++ |
| 18b | $C_8F_{17}SO_2N(C_2H_5)(C_2H_4O)_nH$ (n = 1 to 4) | FC-87 | 0.15 | — — |
| 19a | $C_8F_{17}SO_2N(C_2H_5)(C_2H_4O)_nH$ (n = 1 to 4) | FC-87 | 0.5 | + |
| 19b | $C_8F_{17}SO_2N(C_2H_5)(CH_2CH_2O)_m[CH_2CH(CH_3)O]_nH$ (m = 1, n = 0 to 1) | FC-72 | 0.1 | — — |
| 20 | $C_8F_{17}SO_2N(C_2H_5)(CH_2CH_2O)_m[CH_2CH(CH_3)O]_n$ (m = 1, n = 0 to 5) | FC-72 | 0.1 | + |

COMPARATIVE EXAMPLES C8–C12

Another series of water displacement compositions were prepared using the surface active agents and solvents listed in Table 4. The percent concentrations of the surface active agents and the results of the efficacy of the compositions are also shown.

The efficacy of water displacement compositions as described in Table 4 was evaluated by preparing a water displacement composition by admixing a surface active

TABLE 2

| Example No. | Surface Active Agent | Solvent | Conc. of Agent (wt. %) | Water Removal |
| --- | --- | --- | --- | --- |
| C1 | $C_7F_{15}CONHC_2H_4OH$ | FC-72 | Insoluble | — |
| C2 | $C_{12}F_{25}(OC_2F_4)_3OCF_2CONHC_2H_4OH$ | FC-72 | Insoluble | — |
| C3 | $C_{12}F_{25}(OC_2F_4)_3OCF_2CONHC_2H_4OH$ | FC-72 | Insoluble | — |
| C4 | $C_8F_{17}OC_2F_4CONHC_2H_4OH$ | FC-72 | Insoluble | — |
| C5 | $C_3F_7CONHC_2H_4OH$ | FC-72 | Insoluble | — |
| C6 | $C_4F_9OC_2F_4OCF_2CONHC_2H_4OCH_3$ | FC-72 | 0.2 | — |
| C7 | $C_4F_9OC_2F_4OCF_2CON\underset{\hbox to 1.5em{\hrulefill}}{\phantom{X}}O$ (morpholine ring) | FC-72 | 0.15 | — | agent with a perfluorinated solvent. The testing and evaluation are as described in Examples 2-15.

Comparative Examples C8-C12 demonstrates that as for the carboxamide-based agents, solubility of the surface active agent in the perfluorinated solvent is necessary for water displacement effectiveness.

face active agent with a perfluorinated solvent. The testing and evaluation are as described in Examples 2-15.

TABLE 5

| Example No. | Surface Active Agent and Solvent | Conc. of Agent (wt. %) | Water Removal |
|---|---|---|---|
| 21 | $C_8F_{17}SO_2N(C_2H_5)(C_2H_4O)_nH$ (n = 1 to 4) and perfluorooctane | 0.15 | ++ |
| 22 | $C_8F_{17}SO_2N(C_2H_5)(C_2H_4O)_nH$ (n = 1 to 4) and perfluoro-N-methylmorpholine | 0.15 | ++ |
| 23 | $C_8F_{17}SO_2N(C_2H_5)(C_2H_4O)_nH$ (n = 1 to 4) and perfluoro-N-ethylmorpholine | 0.15 | ++ |
| 24 | $C_8F_{17}SO_2N(C_2H_5)(C_2H_4O)_nH$ (n = 1 to 4) and perfluoro-1,2-bis(trifluoromethyl)hexafluorocyclobutane | 0.15 | ++ (slightly less) |
| 25 | $C_4F_9OC_2F_4OCF_2CONHC_2H_4OH$ and FC-87 | 0.15 | + |
| 26 | $C_4F_9OC_2F_4OCF_2CONHC_2H_4OH$ and FC-87 | 0.5 | + to ++ (~90%) |
| 27 | $C_4F_9OC_2F_4OCF_2CONHC_2H_4OH$ and FC-72 | 0.15 | ++ |
| 28 | $C_4F_9OC_2F_4OCF_2CONHC_2H_4OH$ and FC-84 | 0.15 | ++ |
| 29 | $C_4F_9OC_2F_4OCF_2CONHC_2H_4OH$ and perfluorooctane | 0.15 | ++ |
| 30 | $C_4F_9OC_2F_4OCF_2CONHC_2H_4OH$ and FC-77 | 0.15 | ++ |
| 31 | $C_4F_9OC_2F_4OCF_2CONHC_2H_4OH$ and perfluoro-N-methylmorpholine | 0.15 | ++ |
| 32 | $C_4F_9OC_2F_4OCF_2CONHC_2H_4OH$ and perfluoro-1,2-bis(trifluoromethyl)hexafluorocyclobutane | 0.15 | + to ++ (~90%) |
| 33 | $C_4F_9OC_2F_4OCF_2CONHC_2H_4OH$ and perfluoro-N-ethylmorpholine | 0.15 | ++ |

TABLE 4

| Example No. | Surface Active Agent | Solvent | Conc. of Agent (wt. %) | Water Removal |
|---|---|---|---|---|
| C8 | $C_8F_{17}SO_2N(C_2H_5)C_2H_4O[CH_2CH(CH_3)O]_nH$ ($n_{avg} = 8$) | FC-72 | Insoluble | -- |
| C9 | $C_8F_{17}SO_2N(C_2H_5)(C_2H_4O)_5H$ | FC-72 | <0.1 | -- |
| C10 | $C_8F_{17}SO_2N(C_2H_5)(C_2H_4O)_nH$ ($n_{avg} = 7.5$) | FC-72 | <0.1 | -- |
| C11 | $C_8F_{17}SO_2N(C_2H_5)(C_2H_4O)_3[CH_2CH(CH_3)O]_nH$ ($n_{avg} = 7.5$) | FC-72 | <0.1 | -- |
| C12 | $C_8F_{17}SO_2N(C_2H_5)(C_2H_4O)_n(CH_2CH(OH)CH_3)_m$ (n = 1 m = 0 (66%)) (n = 1 m = 1 (34%)) | FC-72 | 0.1 | -- |

EXAMPLES 21-33

A series of water displacement compositions were prepared using the first and second subclasses of surface active agents and various solvents, as listed in Tables 5a to 5c. The percent concentrations of the surface active agents and the results of the efficacy of the compositions are also shown.

The efficacy of water displacement compositions as described in Tables 5a to 5c was evaluated by preparing a water displacement composition by admixing a surface active agent with a perfluorinated solvent. The The preceding examples have demonstrated the scope of this invention. In addition to showing the range of $R_f$ groups that lead to successful water displacement compositions, they demonstrate that solubility of the surface agent in the perfluorinated solvent is an important factor in the performance of the water displacement compositions. Surface active agents that are insoluble or of very low solubility yield ineffective water displacement compositions. Both carboxamide and sulfonamide containing surface active agents were found to be effective. The presence of more than one hydroxyl group was also shown to lead to an effective water displacement composition. The compound in which two carboxamidoalkanols groups were separated by a divalent perfluoroaliphatic chain was also found to be effective.

Various modifications and alterations of this invention will become apparent to those skilled in the art without departing from the scope and spirit of the present invention, and it should be understood that this invention is not to be unduly limited to the illustrative embodiments set forth hereinabove.

We claim:

1. A liquid composition comprising (a) predominantly by weight, a normally liquid, perfluorinated, chlorine-free, inert solvent and (b) a nonionic, fluoroaliphatic surface active agent where in said surface active agent is selected from the group consisting of perfluoroaliphatic amidoalkanols, perfluoroaliphatic carboxamidoalkanols and perfluoroaliphatic sulfonamidoalkanols, soluble in said solvent wherein said surface active agent is selected from the group consisting of perfluoroaliphatic amidoalkanols, perfluoroaliphatic carboximidoalkanols, and perfluoroaliphatic sufonomidoalkanols.

2. The liquid composition according to claim 1 wherein said perfluorinated, chlorine-free, inert solvent is a perfluoroaliphatic or perfluorocycloaliphatic compound having 5 to 18 carbon atoms.

3. The liquid composition according to claim 1 wherein said perfluorinated, chlorine-free, inert solvent is a perfluoroaliphatic or perfluorocycloaliphatic compound having 5 to 18 carbon atoms and contains one or more catenary heteroatoms, wherein said heteroatoms are divalent oxygen or trivalent nitrogen.

4. The liquid composition according to claim 3 wherein said perfluorinated, chlorine-free, inert solvent is selected from the group consisting of perfluoropentane, perfluorohexane, perfluoroheptane, perfluorooctane, perfluoro-N-methylmorpholine, perfluoro-N-ethylmorpholine, perfluoro-N-methyl pyrrolidine, perfluoro-1,2-bis(trifluoromethyl)hexafluorocyclobutane, perfluoro-2-butyltetrahydrofuran, perfluorotriethylamine, perfluorodibutyl ether, perfluorotributyl amine, perfluorotriamyl amine, and mixtures thereof.

5. The liquid composition according to claim 1 wherein said surface active agent is a nonionic, perfluoroaliphatic amidoalkanol.

6. The liquid composition according to claim 5 wherein the concentration of said surface active agent is in the range of 0.01 wt. % to 5 wt. % relative to said perfluorinated, chlorine-free, inert solvent.

7. The liquid composition according to claim 6 wherein said surface active agent is represented by the general formula:

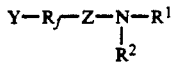

wherein
$R_f$ is a divalent, inert, fluoroaliphatic group containing 3 to 20 carbon atoms, such that the skeletal chain of $R_f$ is straight chain, branched chain, if sufficiently large, cyclic, or combinations thereof, such as alkylcycloaliphatic radicals, further the skeletal chain optionally includes one or more catenary divalent oxygen or trivalent nitrogen atoms bonded only to carbon atoms, such heteroatom being a chemically stable linkage between fluorocarbon portions of the fluoroaliphatic group and not interfering with the inert character of the $R_f$ group;

$R^1$ is hydrogen or a lower alkyl group having 1 to 6 carbon atoms, which can be straight chain, branched chain or cyclic or combinations thereof, such as alkylcycloaliphatic radicals;

$R^2$ is an aliphatic group containing 2 to 12 carbon atoms, and further contains at least one hydroxyl which may be terminal, such that the skeletal chain of $R^2$ is straight chain, branched chain, and if sufficiently large, cyclic, or combinations thereof, such as alkylcycloaliphatic radicals, and further the skeletal chain optionally includes one or more catenary heteroatoms, such as a divalent oxygen bonded only to carbon atoms;

Z is a carbonyl group or a sulfonyl group; and

Y is a fluorine, $F_5SCF_2$-, or

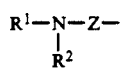

wherein, $R^1$, $R^2$, and Z are as defined above.

8. The liquid composition according to claim 6 wherein said surface active agent is represented by the general formula:

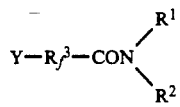

wherein
$R^3_f$ is a divalent, inert, fluoroaliphatic group containing 3 to 12 carbon atoms, such that the skeletal chain of $R^3_f$ is a straight chain, branched, and if sufficiently large, cyclic, or combinations thereof, and contains carbon, fluorine, and at least one catenary divalent oxygen or a trivalent nitrogen bonded only to carbon atoms, such heteroatom being a chemically stable linkage between fluorocarbon portions of the fluoroaliphatic group and not interfering with the inert character of the $R^3_f$ group;

$R^1$ is a hydrogen or a lower alkyl group having 1 to 6 carbon atoms, which can be straight chain, branched chain or cyclic, or combinations thereof;

$R^2$ is an aliphatic group containing 2 to 12 carbon atoms, such that the skeletal chain of $R^2$ is a straight chain, branched chain or cyclic, or combinations thereof, contains at least one hydroxyl, which may be terminal, and can contain one or more heteroatoms, such as a catenary divalent oxygen bonded only to carbon atoms; and Y is a fluorine, $F_5SCF_2$-, or

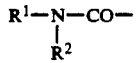

wherein $R^1$, and $R^2$ are as defined above.

9. The liquid composition according to claim 6 wherein said surface active agent is represented by the general formula:

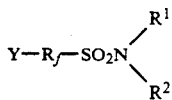

wherein $R_f$ is a divalent, inert, fluoroaliphatic group containing 3 to 20 carbon atoms, such that the skeletal chain of $R_f$ is straight chain, branched chain, and if sufficiently large, cyclic, or combinations thereof, such as alkylcycloaliphatic radicals, the skeletal chain optionally includes at least one catenary divalent oxygen or trivalent nitrogen bonded only to carbon atoms, such heteroatom being a chemically stable linkage between fluorocarbon portions of the fluoroaliphatic group and not interfering with the inert character of the $R_f$ group;

$R^1$ is hydrogen or a lower alkyl group having 1 to 6 carbon atoms, which can be straight chain, branched chain or cyclic, or combinations thereof, such as alkylcycloaliphatic radicals;

$R^2$ is an aliphatic group containing 2 to 12 carbon atoms, and further contains at least one hydroxyl group, which may be terminal, such that the skeletal chain of $R^2$ is straight chain, branched chain, and if sufficiently large, cyclic, or combinations thereof, such as alkylcycloaliphatic radicals, and can further include one or more heteroatoms, such as a catenary divalent oxygen bonded only to carbon atoms; and Y is a fluorine, $F_5SCF_2$- or

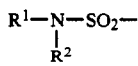

wherein $R^1$, and $R^2$ are as defined above.

10. A water displacement liquid comprising (a) predominantly by weight, perfluorohexane, and (b) a surface active agent selected from the group consisting of $C_6F_{13}OC_2F_4OCF_2CONHC_2H_4OH$ and $C_4F_9OC_2F_4OCF_2CONHC_2H_4OH$.

* * * * *

UNITED STATES PATENT AND TRADEMARK OFFICE
CERTIFICATE OF CORRECTION

PATENT NO. : 5,089,152
DATED : February 18, 1992
INVENTOR(S) : Flynn et al.

It is certified that error appears in the above-identified patent and that said Letters Patent is hereby corrected as shown below:

Abstract, line 6, After with insert --a--

Col. 2, line 16, "quanternary" should be --quaternary--

Col. 2, line 35, "described" should be --describe--

Col. 2, line 46/47, "significatnly" should be --significantly--

Col. 5, formula II, " $R_f^3$ " should be -- $R^3{}_f$ --

Col. 13, line 14-18, beginning at "where in said" and ending at "sulfonamidoalkanols" delete Col. 14, line 31, " $R_f^3$ " should be -- $R^3{}_f$ --

Signed and Sealed this

Twenty-second Day of June, 1993

Attest:

MICHAEL K. KIRK

*Attesting Officer*     *Acting Commissioner of Patents and Trademarks*